United States Patent [19]

Katchmar

[11] Patent Number: 5,661,902

[45] Date of Patent: Sep. 2, 1997

[54] METHODS OF MAKING PRINTED CIRCUIT BOARDS AND HEAT SINK STRUCTURES

[75] Inventor: Roman Katchmar, Ottawa, Canada

[73] Assignee: Northern Telecom Limited, Montreal, Canada

[21] Appl. No.: 496,649

[22] Filed: Jun. 29, 1995

Related U.S. Application Data

[62] Division of Ser. No. 133,396, Oct. 8, 1993, Pat. No. 5,467, 251.

[51] Int. Cl.$^6$ .................................................. H05K 3/34
[52] U.S. Cl. .......................... 29/840; 29/832; 174/252; 361/719
[58] Field of Search .......................... 29/840, 832, 852; 228/179.1; 361/705, 719; 174/252, 16.3

[56] References Cited

U.S. PATENT DOCUMENTS

| | | | |
|---|---|---|---|
| 4,654,966 | 4/1987 | Kohara et al. | 29/840 |
| 4,729,061 | 3/1988 | Brown | 361/386 |
| 4,849,856 | 7/1989 | Fukari | 361/386 |
| 4,914,551 | 4/1990 | Anccbel | 361/384 |
| 4,924,352 | 5/1990 | Septfons | 29/840 X |
| 4,959,900 | 10/1990 | de Givry | 29/840 |
| 5,095,404 | 3/1992 | Chao | 361/385 |
| 5,177,669 | 1/1993 | Juskey | 257/675 |
| 5,218,516 | 6/1993 | Collins | 361/386 |
| 5,223,747 | 6/1993 | Tschulena | 257/713 |
| 5,262,922 | 11/1993 | Yamaji | 361/720 |
| 5,294,826 | 3/1994 | Marcantonio | 257/659 |

*Primary Examiner*—Peter Vo
*Assistant Examiner*—Khan V. Nguyen
*Attorney, Agent, or Firm*—R. J. Austin

[57] ABSTRACT

A method of making a printed circuit board and heat sink structure by initially providing the board with a heat conductive layer on each of its two sides, the two conductive layers thermally interconnected by heat conductive material extending through holes in the board. An electronic component is mounted spaced apart from the conductive layer on one side of the board and is thermally connected to that layer by a thermally conductive viscous substance injected through a hole from the other side of the board. The viscous material flows in a reverse direction through other holes in the board. A heat sink is then attached by thermally conductive material to the conductive layer on the other side of the board. A method is also included of injecting a thermally conductive curable resin between an electronic component and a printed circuit board with a release agent between the component and the resin. After cooling the resin at sufficiently high temperature for it to be in contact with the release agent, the cured resin cools and shrinks away from the component. Subsequent heating of the resin expands it into heat conductive engagement with the component for quicker release of heat therefrom.

4 Claims, 5 Drawing Sheets

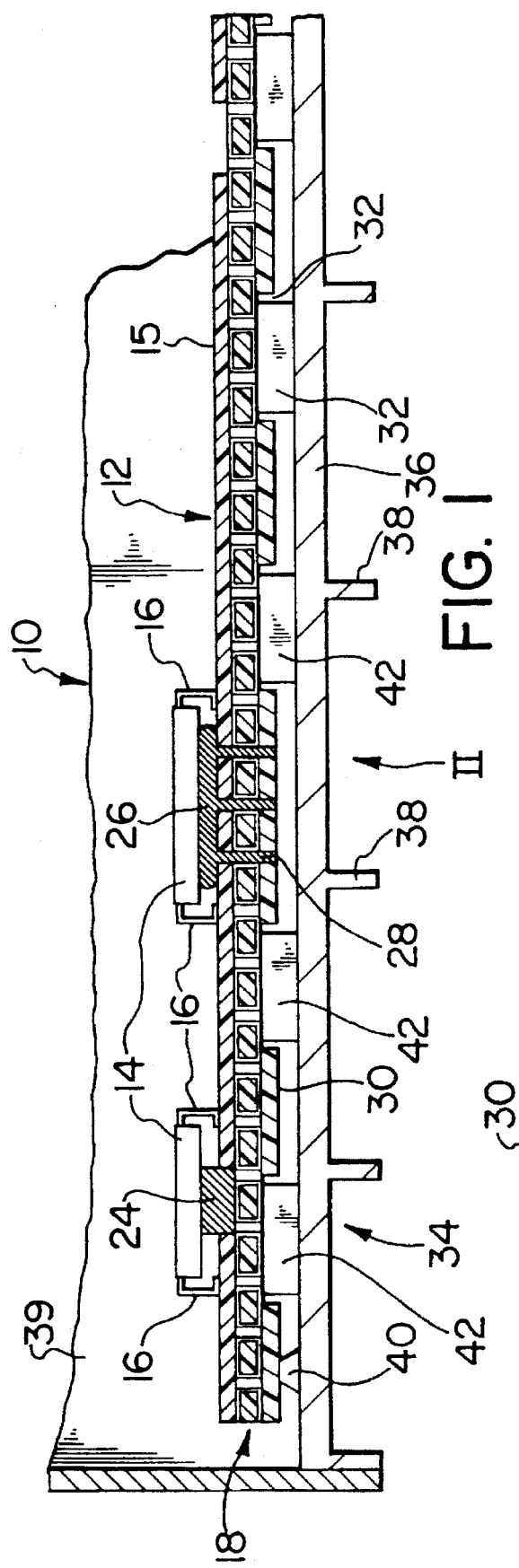
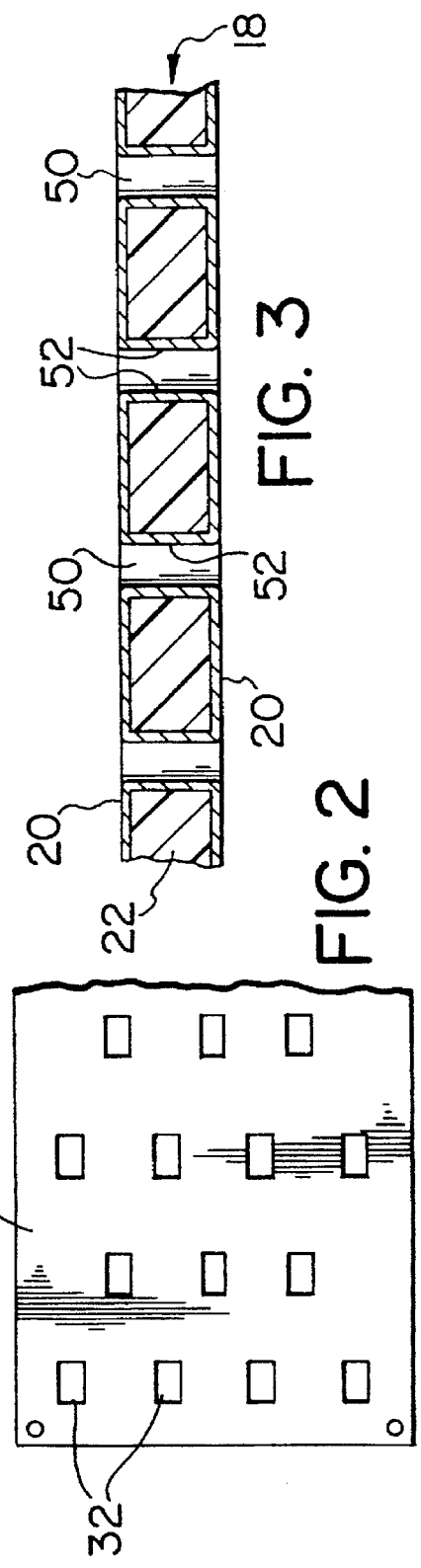

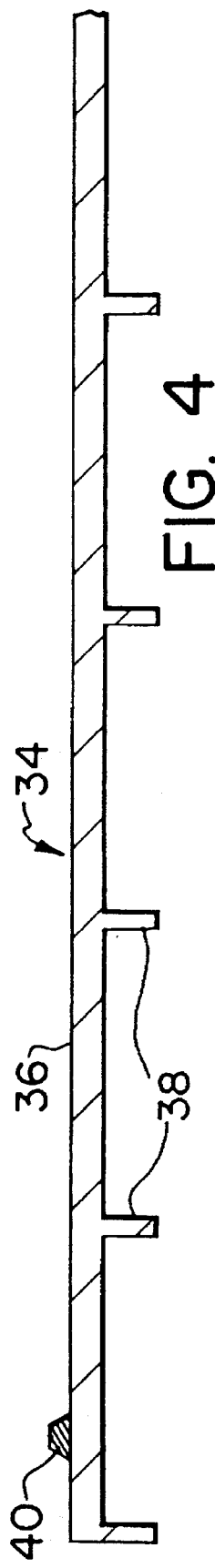
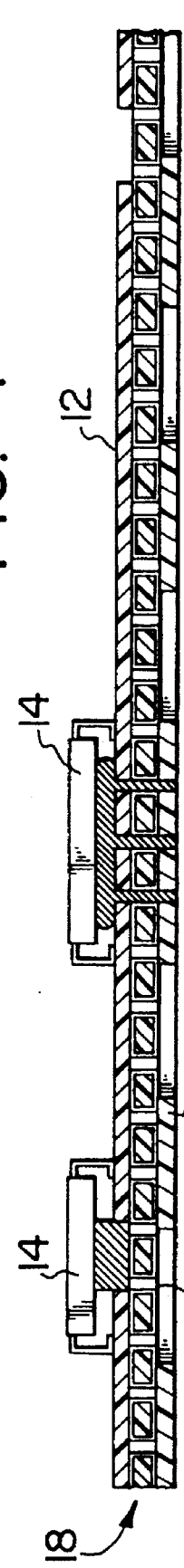
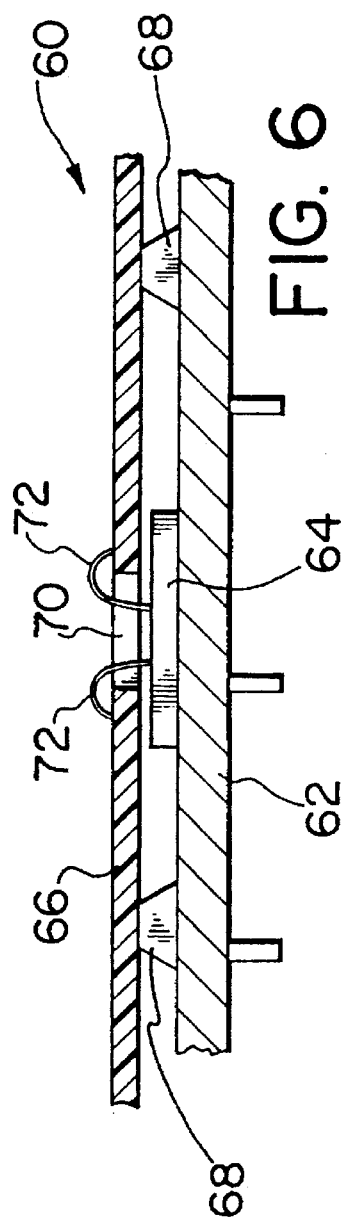

METHODS OF MAKING PRINTED CIRCUIT BOARDS AND HEAT SINK STRUCTURES

This is a division of patent application Ser. No. 08/133, 396, filed on Oct. 8, 1993 by Roman Katchmar for "PRINTED CIRCUIT BOARDS AND HEAT SINK STRUCTURES", now U.S. Pat. No. 5,461,253.

This invention relates to method of making printed circuit boards and heat sink structures.

In designs of structures comprising printed circuit boards and heat sink arrangements, the arrangements are such that there are relative expansion and contraction problems between the elements and also there are heat dissipation problems. The expansion and contraction problems result in mechanical stresses which can result in electronic failure. On the other hand, the heat dissipation problems are such that heat is not distributed in a satisfactory manner throughout the structures and hot and cold spots result. Within the cold spot areas, during use and around power idling conditions, it is known that there may be water vapor intrusion and condensation locally upon the boards which causes a dentritic growth (or filament growth) of conductor material (such as copper) through or on the surfaces of the substrate layers of the board which may result in shorting failures, and there may be also oxidation upon the surfaces of the electronic parts and upon leads. In addition, mold growths may also be encountered together with other surface corrosion problems. Furthermore, accumulation of hydgroscopic dust, which will conduct electrical current below relative humidity conditions required for condensation, can produce intermittent electrical failures. Any of these developments may result in circuitry shorting and breakdown and general deterioration of the structures. Prior examples of printed circuit board and heat sink structures include structures such as described in U.S. Pat. No. 5,218,516 granted in the name of H. M. Collins, et al on Jun. 8, 1993. As shown in that specification, a heat exchanger or heat sink lies in contact completely along one side of a printed circuit board fitted with surface components. With this arrangement, while being efficient in the removal of heat from the printed circuit board, it is possible for cold spots to develop in the printed circuit board which could result in the possibility of problems arising, such as discussed above.

The present invention seeks to provide a printed circuit board and heat sink structure which minimizes or overcomes the above problems. In particular, the invention seeks particularly to satisfy conditions in which electronic circuitry is to be physically isolated from a surrounding and possibly hostile environment (e.g. weather conditions) and perhaps not hermetically sealed.

According to one aspect of the present invention there is provided a printed circuit board and heat sink structure comprising a printed circuit board having a circuitry layer, electronic components mounted upon one side of the circuitry layer, a heat conductive layer means extending across the opposite side of the circuitry layer in heat conductive relationship with the electronic components for conveying heat from the components into the heat conductive layer means, and a heat sink spaced from the heat conductive layer means, the heat sink connected to the heat conductive layer means by heat conductive pathways, to transmit heat into the heat sink, the pathways limiting the rate of transfer of heat into the heat sink such as to enable distribution of heat from the electrical components throughout the heat conductive layer means.

Because the heat transfer into the heat sink is controlled and limited, this allows for the heat to be both dissipated and distributed throughout the structure whereby any cold spots upon the printed circuit board are eliminated. Thus, problems associated with cold spots no longer arise, such problems including water vapor intrusion and condensation upon the boards and resultant copper dandritic or filament growth between layers, wet dust bridging between conductors, and mold growths and other surface corrosions. Also, with the structure according to the invention hot spots are also removed from regions of the board, such hot spots potentially creating overheating problems with certain electrical components.

In a preferred arrangement, according to the above inventive concept the heat conductive layer means comprises a first and second heat conductive layers which are spaced apart by heat insulating material and are connected to one another by heat conductive members extending through the insulating material, the first of the heat conductive layers being in heat conductive relationship with the electronic components and the second conductive layer being in heat exchange relationship with the heat sink by the heat conductive pathways. With this arrangement, the first and second heat conductive layers are substantially symmetrically placed relative to a neutral axis of the printed circuit board whereby warping of the structure is avoided or minimized as the two spaced apart heat conductive layers control temperature through the thickness of the structure with very small temperature differentials across the layers. Alternatively, there may be a thicker heat conductive layer substantially symmetrical about the neutral axis or more than two heat conductive layers are provided, these layers when considered together being substantially symmetrical about the neutral axis and interconnected by heat insulating material.

In one preferred arrangement, there is disposed a layer of dielectric and heat insulating material between the second heat conductive layer and the heat sink, this particular layer being spaced from the heat sink by the heat conductive pathways and carrying electronic components upon the layer, the components located between the heat sink and the other layer.

According to a further aspect of the present invention there is provided a method of making a printed circuit board and heat sink structure comprising: providing a circuitry layer and electronic components upon the circuitry layer; providing a subassembly of a heat insulating layer and a first and second heat conductive layers, disposed one upon each side of and extending across the heat insulating layer, the conductive layers interconnected by heat conductive members extending through the heat insulating layer; mounting the circuitry layer upon one side of the subassembly and providing heat conductive means between the electronic components and the first heat conductive layer; and locating a heat sink on the other side of the subassembly and in a position spaced from the second heat conductive layer, and connecting the heat sink with the second heat conductive layer by heat conductive pathways extending between the heat sink and the second heat conductive layer.

According to another aspect of the invention, there is provided a printed circuit board and heat sink structure comprising a printed circuit board, at least one electronic component electrically connected to the printed circuit board, and a heat sink, the electronic component mounted upon the heat sink with the heat sink and electronic component held spaced away from the printed circuit board.

With the above structure according to the last preceding paragraph, heat is directed straight into the heat sink while being directed away from the printed circuit board. It also allows for removal of the printed circuit board from the heat sink for maintenance or replacement purposes without any difficulty apart from the severing of connection between the electronic component and the printed circuit board. The location of the heat sink away from the printed circuit board enables relative expansions and contractions of the printed circuit board and the heat sink while avoiding thermally induced stresses between the parts. To enable unrestricted relative expansion and contraction to take place, compliant electrical leads should be positioned between the electronic component and the terminals on the printed circuit board.

In one arrangement, the electronic components may comprise a single electronic device, e.g. an electronic chip or die. Alternatively, the electronic component comprises a plurality of electronic devices mounted upon a support which is mounted upon the heat sink. With this arrangement, electronic devices are grouped together to enable their heat extraction to take place in one region directly into the heat sink. In addition, the support may itself comprise a secondary printed circuit board, the electronic devices being electrically connected to the secondary printed circuit board. Alternatively, the secondary printed circuit board may be replaced by a ceramic resistor circuitry.

The invention further provides a practical method of making a printed circuit board and heat sink structure which is constructed for the purpose of removing heat from the electrical component into the heat sink.

Accordingly, a further aspect of the invention provides a method of making a printed circuit board and heat sink structure comprising: providing a printed circuit board with a heat conductive layer on each side of the board and with heat conductive material extending through apertures in the board to thermally interconnect the two conductive layers; and locating a heat sink on one side of the board in heat conductive relationship with the conductive layer on said one side and locating an electronic component in heat conductive relationship with the conductive layer on the other side of the board.

Conveniently, in a preferred arrangement, the two conductive layers are formed by layers of copper on the two sides of the board and the heat conductive material extending through the holes comprises copper which coats the surfaces of the holes.

A further problem which may arise is that of controlling the manner in which heat is extracted from electronic components mounted upon a board. As may be seen, conventionally, immediately electronic components are operated, their temperatures rise above ambient temperature and heat is extracted from the components to be diverted through a heat sink. In some ways, such a procedure is disadvantageous because an undesirable amount of time may be required for the electronic components to heat up to their desirable operating temperatures at which they are most efficient. In addition, where heat commences to be extracted from the electronic components as soon as the components commence to increase in temperature, there is always the possibility that condensation may coat relatively cold surfaces due to surrounding humidity conditions and such condensation may lead to deterioration in the electronic equipment. It would be an advantage therefore if temperatures of electronic components could be increased as quickly as possible towards their fully operational temperatures so as to minimize situations where condensation may result. In addition, it would also be an advantage that when components are in an idling state when their temperatures are lower than in their fully operational state, heat need not be extracted from them positively, to provide surrounding temperature conditions and control humidity.

According to yet a further aspect of the invention there is provided a method of making a printed circuit board and heat sink structure comprising mounting an electronic component upon one side of a printed circuit board and in a position spaced from the board and with electrical leads of the component connected to electrical terminals of the board; injecting a thermally conductive curable resin between the electronic component and the board, the resin prevented from engaging the surface of the component by the presence of a release agent between the components and the resin; and then at a desired temperature curing the resin to form a thermally conductive mass, the mass contracting away from the electronic component upon cooling.

The invention also provides a printed circuit board and heat sink structure comprising: a printed circuit board having an electronic component connected to electronic circuitry terminals on the board, the component being spaced apart from the board, the component having a fully operational temperature at which heat is required to be removed from the component; and a cured thermally conductive resinous mass disposed between the board and the component, the mass being spaced from the component for component temperatures below the fully operational temperature, and the mass being expandable under the influence of convected and radiated heat during heating of the component so as to contact the component to conduct heat away from the component at the fully operational temperature.

Embodiments of the invention will now be described by way of example with reference to the accompanying drawings, in which:

FIG. 1 is a cross-sectional view through a printed circuit board and heat sink structure according to a first embodiment;

FIG. 2 is a view in the direction of arrow 2 in FIG. 1 of a printed circuit board of the structure of the first embodiment and with the heat sink removed;

FIG. 3 is a cross-sectional view to larger scale through a substrate of the structure of the first embodiment showing a detail and part of the process for making the structure;

FIG. 4 is a view similar to FIG. 1 of a detail of the heat sink;

FIG. 5 is a view similar to FIG. 1 of the completed printed circuit board of the structure of the first embodiment;

FIG. 6 is a cross-sectional view through a printed circuit board and heat sink structure according to a second embodiment;

Figure 7:
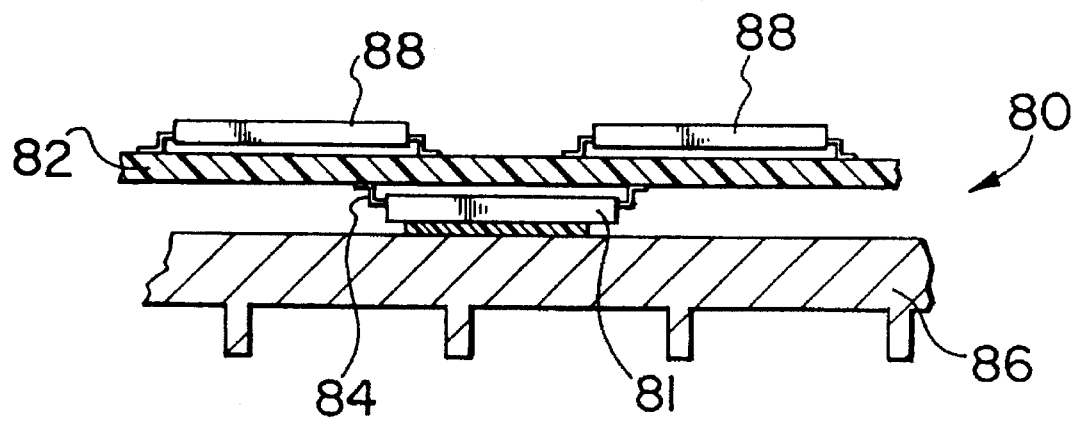
FIG. 7 is a view similar to FIG. 6 of a third embodiment.

In a first embodiment as shown in FIG. 1, a printed circuit board and heat sink structure 10, comprises a printed circuit board 12 with a plurality of electrical components 14 mounted upon one side of a circuit layer 15, which is a primary circuit layer, with electrical leads 16 connected to electrical terminals (not shown) of the board. A heat conductive layer means 18 is disposed upon the other side of the layer 15 in heat conductive relationship with the electronic components 14 as will now be described.

The heat conductive layer means comprises two layers 20 of highly thermally conductive material, e.g. copper (FIG. 3) disposed one on each side of a dielectric and thermally insulating layer 22, the two layers 20 being interconnected through holes in the layer 22 by copper layers around the surfaces of holes in the layer 22 as will be described. The component 14 on the left-hand side of FIG. 1 is thermally connected to the layers 20 by means of a copper pedestal 24 which engages the surface of the component and extends through a hole in the layer 15 and into engagement with the nearest copper layer 20. The next electronic component 14 on the right is thermally connected to the two layers 20 by means of a heat conductive mass 26 disposed beneath the electronic component, the mass being a thermally conductive elastomeric adhesive or gel which also extends as projections 28 through holes in the substrate 12 and 18 so as to intimately contact the copper layers 20. The mass 26 may for instance be a silicone based thermal coductive gel or elastomeric adhesive with a low modulus of elasticity below 5000 psi and preferably below 150 and even below 100 psi.

On the side of the heat conductive layer means 18 remote from the primary circuit layer 15 is disposed a secondary circuit layer 30 which is formed with spaced apart rectangular wells or cutouts 32 as shown particularly in FIG. 2 the wells being located in thermomechanically desirable positions according to a fixed pattern. A heat sink 34 is disposed in a position opposing but spaced from the layer 30. The heat sink has a substantially planar body 36 with fins 38 outstanding from the surface remote from the secondary circuit layer 30 and the body 36 is spaced from the layer 30 by upstanding spacers 40 provided upon the heat sink. The structure 10 is located within a housing 39 (FIG. 1) with the body 36 of the heat sink forming a wall of the housing and with the fins 38 extending outside the housing for passage of air across the fins for removal of heat. The printed circuit board 12 together with the components 14 are thus protected within the housing.

Heat conductive pathways are provided to connect the heat sink to the two copper layers 20. The heat conductive pathways are provided by a plurality of heat conductive bridges 42 which are disposed within the cutouts 32 and are secured to the adjacent copper layer 20 and also to the body 36 of the heat sink by a thermally conductive adhesive such as mentioned above. The heat conductive bridges 42 are of U-shape, with the legs of the U of each bridge secured to the copper layer 20 and to the heat sink 34 and with the base of the U interconnecting the legs.

The spacers 40 on the heat sink 34 may be sufficiently deep to provide a large enough space between the layer 30 and the heat sink body 36 to enable electronic components (not shown) also to be carried in the gap between the layer 30 and the heat sink body.

The intent of the design of the structure of the first embodiment is for controlling the method of removal of heat from the electronic components so as to eliminate or minimize as far as possible any cold spots which may develop or remain in the structure during use, such cold spots possibly resulting in water vapor intrusion and condensation upon the board structures. Such cold spots could, for instance, cause copper dentritic or other filament growth between layers, the growth being between conductive materials to cause shorting, mold growths and other surface corrosion possibilities. With this in mind, it is intended that the heat should be distributed from the electronic components 14 across the whole of the structure and in the plane of the structure before being removed by the heat sink 34. It is not the intention therefore of the embodiment to enable the heat to be removed immediately from each of the components directly into the heat sink because this may result in the localized cold spots to which reference has been made above. The arrangement is such therefore that the U-shaped bridges 42 are of sufficient number and area of contact with the adjacent copper layer 20 to remove the heat from the heat conductive layer means 18 in a controlled manner thereby enabling the heat from the components 14 to be dissipated and distributed throughout the copper layers 20 while the heat is also removed at the controlled rate by the bridges 42.

Thus, in use, as heat develops in each of the electronic components 14, it is conveyed by the heat exchange mediums 24 and 26 described above into the copper layers 20, the interconnecting copper material in the holes in the layer 22 also assisting in this action. Thus, the structure of the first embodiment provides for overall heating of the printed circuit board so that no cold spots remain, the heat from each of the components 14 assisting in heating the copper layers 20 overall with the heat being dissipated more evenly to provide a more uniform overall temperature in the board than has previously been obtainable. Any heat which is removed passes through the bridge members 42 and into the heat sink for conduction into a cooling air stream which passes by the fins 38.

Further to the above considerations, the heat conductive layer means 18 is of special construction to control temperature differentials and provide a small temperature drop across the layers from top to bottom of the structure. With this intent in mind, the means 18 is provided by the two copper layers which are spaced apart by the layer 22 and the temperature difference between the two copper layers is substantially negligible so that little or negligible thermally induced flexing of the structure results thus maximizing interconnect reliability at solder joints which are normally very susceptible to breakage.

It is also of advantage to have the bridge members 42 secured in position between the heat sink and the closer copper layer 20 by means of a very flexible adhesive which may be a silicone based adhesive referred to above. This allows for relative expansion and contractions of the printed circuit board assembly relative to the heat sink 34 thereby reducing thermally induced stresses as much as possible. Relative expansion and contraction is assisted by maximizing the thickness of the adhesive. Alternatively, (not shown) to retain the heat sink assembled to the printed circuit board, the board is secured by screws to the heat sink, the screws possibly being in clearance holes for differential thermal expansion of the parts. In another alternative, the board 12 is urged against the heat sink by compression springs mounted within the housing. In these two alternatives, thermally conductive gel would be present between the bridges 42 and the copper layer 20 on one side and the heat sink 34 on the other. Alternatively, each of the bridges 42 is replaced by a heat conductive pedestal, e.g. of copper or aluminum which is bonded by thermally conductive adhesive to the heat sink and the nearest copper layer 20. Instead, however, a thick conductive adhesive may replace each bridge 42.

Conveniently, in the manufacture of the structure, the heat conductive layer means 18 is formed of a subassembly having its two copper layers 20 mounted upon the layer 22 as shown in FIG. 3, the copper layers 20 being mounted upon the layer 22 in conventional manner for printed circuit board manufacture. Prepared holes 50 are then provided through the layer 22 the holes each being coated or plated with a copper layer 52 which interconnects the layers 20 for heat exchange purposes. Subsequently, with the components 14 on the layer 15, the layers 15 and 30 are added to the structure 18. This provides the printed circuit board structure as shown in FIG. 5 to which the heat sink 34 is subsequently added by the addition of the bridging members 42.

In a second embodiment to be described, a printed circuit board and heat sink structure is designed for the purpose of removing heat from heat generating electronic components directly into a heat sink while bypassing a printed circuit board, the arrangement also being such that any relative movement between the printed circuit board and the heat sink does not produce thermally induced stresses.

As shown by the second embodiment (FIG. 6), a printed circuit board and heat sink structure 60 comprises a planar heat sink 62 upon which a plurality of electronic components (e.g. component 64) are mounted directly for heat conduction purposes. The heat sink and components 64 are spaced away from a printed circuit board 66 by spacers 68 which may be formed integrally with or separately attached to the heat sink. Each electronic component 64, in this embodiment, is in the form of a die or a chip and is aligned with a small aperture 70 in the printed circuit board 66. The die or chip 64 is connected by compliant electrical leads 72 which extend from the chip through the aperture 70 to be connected with electrical terminals on the opposite side of the board 66. As may be seen, the heat sink and the die or chip 64 may be disposed relatively closely to the board 66 and with the leads 72 extending to the other side of the board, the leads are lengthy so as to increase their flexibility and allow for free thermally induced relative movement between the board 66 and the heat sink 62. As in the first embodiment, the projections 68 may be adhered to the board 66 by the use of a flexible adhesive.

In a third embodiment as shown in FIG. 7, a printed circuit board and heat sink structure 80 has an electronic component in the form of a single electronic device 81 (i.e. a die or chip) mounted on one side of a printed circuit board 82 with electrical leads 84 connected to terminals on that side of the board. A heat sink 86 is connected to the device 81 by a flexible adhesive such as a silicone based adhesive. On the other side of the board two further devices 88 are also mounted.

Figure 8:
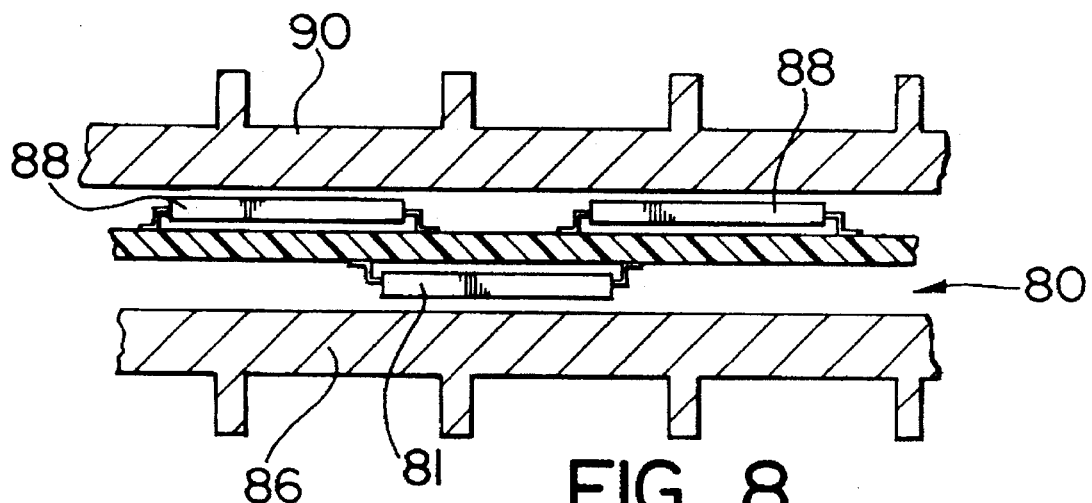
FIG. 8 is a view similar to FIG. 7 of a modification to the third embodiment.

In a modification of the third embodiment as shown in FIG. 8, an additional heat sink 90 is provided upon the other side of the board 82 with the devices 88 secured to the heat sink 90.

Figure 9:
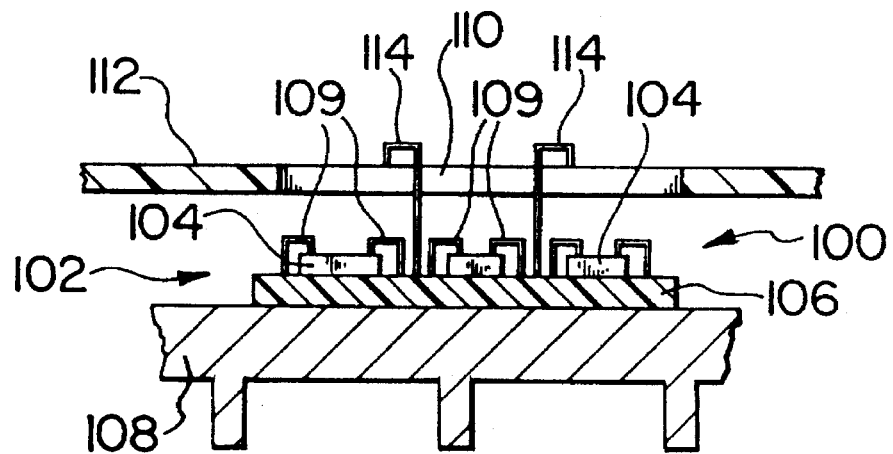
FIG. 9 is a cross-sectional view through a printed circuit board and heat sink structure according to a fourth embodiment.

As shown by FIG. 9, in a fourth embodiment, a structure 100 is similar to that of the second embodiment in FIG. 6 except that the component 64 in FIG. 6 is replaced by an assembly 102 in which a group of devices 104 are provided from which heat needs to be extracted during use. As shown in FIG. 9 the assembly 102 comprises a PCB or a ceramic base 106 upon which the components 104 are mounted, the base 106 being adhesively secured to one side of a heat sink 108. Electrical leads 109 from the devices 104 are connected to terminals upon the base 106 with compliant electrical leads 114, passing from the base 106, through an aperture 110 in a board 112 as described in the second embodiment to be connected to terminals on the other side of the board.

The constructions described in the third and fourth embodiments have the advantages expressed for the structure of the second embodiment.

In a fifth embodiment, now to be described, a convenient method is provided for mounting electronic components on a side of a printed circuit board while enabling the use of a heat sink for heat removal.

Figure 10:
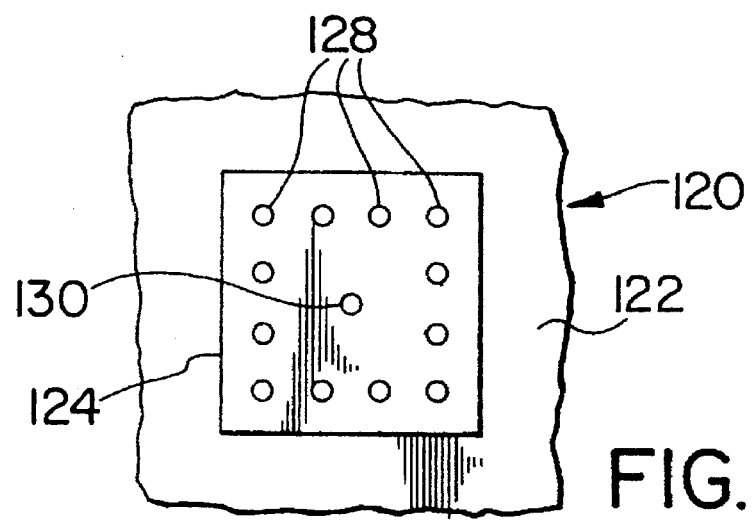
FIG. 10 is a plan view of part of a substrate of a printed circuit board and heat sink structure according to a fifth embodiment.
Figure 11:
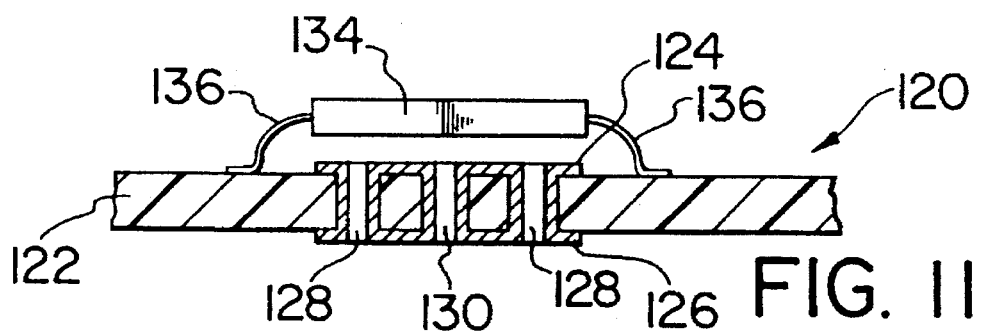
FIGS. 11, 12 and 13 are cross-sectional views through the structure of the fifth embodiment at different stages of manufacture.

As shown in FIGS. 10 and 11, a printed circuit board 120 is provided which is formed from a dielectric substrate 122 which initially had, on its two sides, layers of copper which had been etched in conventional fashion for providing necessary circuitry upon the two sides of the substrate. The embodiment differs from conventional practice however in that at every site on the one side of the board where an electronic component is to be mounted, a rectangular or square copper pad 124 of the original copper layer remains and which will underlie the electronic component. Through the substrate 122, the pad 124 and a similar pad 126 directly on the other side of the board a plurality of holes 128 are provided, the holes 128 being in any desirable position for the purpose of adding a mass of thermally conductive viscous resin in a manner to be described. A central hole 130 is also provided through the pads 124 and 126 and through the substrate 122. The holes 128 and 130 are each coated or plated with a layer of copper which thermally connects the two copper pads 124 and 126. As in the first embodiment, while copper is preferred for this purpose other thermally conductive material such as silicone based thermally conductive gel or adhesive may instead be used.

With each of the components 134 located in a position spaced away from the underlying pad 124, electrical leads 136 of the components are joined to electrical terminals of circuitry carried by the board (FIG. 11).

Figure 12:
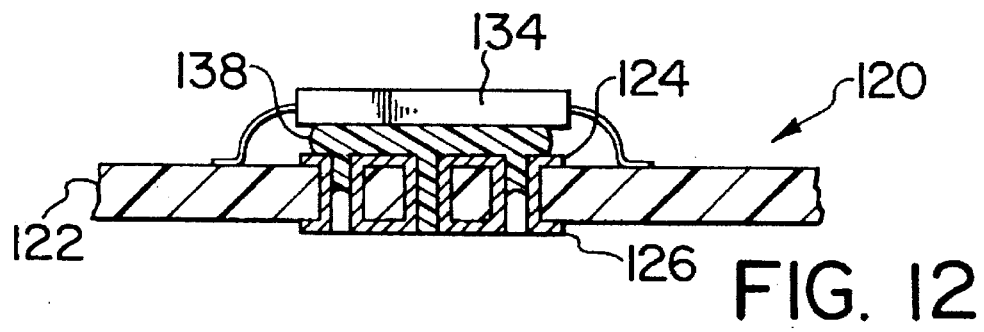

A thermally conductive viscous substance is formed into a mass 138 between each of the components 134 and the pad 124 as shown by FIG. 12. To effect this mass 138, the viscous substance, which may be in form of the silicone based thermally conductive adhesive as described above, is injected from beneath the printed circuit board and through the hole 130 so that the substance spreads between and in contact with each component 134 and its associated copper pad 124. In order to produce a positive board, the surfaces must be cleared for good adhesion and a primer should be used which may be applied directly to the surfaces or incorporated into the mass 138. Sufficient of the material is injected so that it flows in reverse direction into the holes 128, the substance then curing in position to thermally connect each component 34 with its pad 124. In this condition, the holes 128 may be at least partially filled with the mass 138 as shown by FIG. 12.

Figure 13:
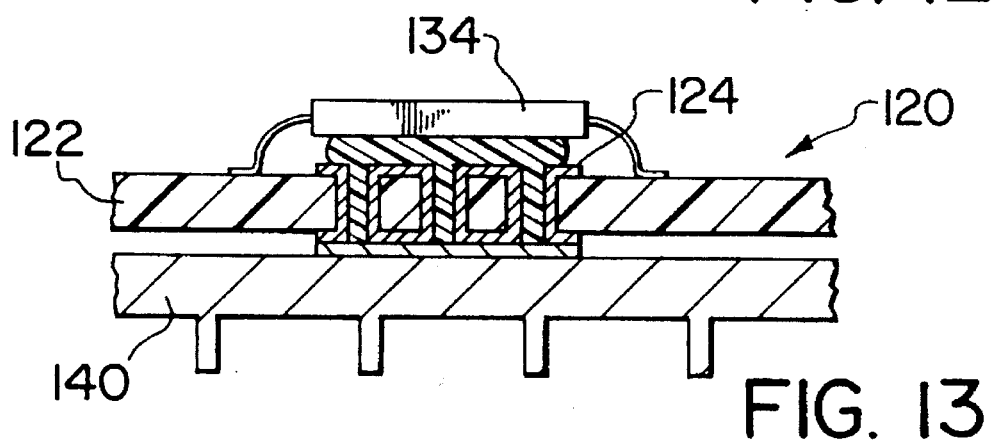

Subsequently, a heat sink 140 is added onto the other side of the printed circuit board in the location shown in FIG. 13, the heat sink 140 being thermally bonded to all of the pads 126 also by silicone based thermally conductive adhesive to form a thermally conductive mass 142.

As may be realized from the fifth embodiment, the method of manufacture described conveniently produces an arrangement in which each of the electronic components 134 is thermally connected to the heat sink 140 by using simple manufacturing steps. In the finished structure of coarse, each component 134 is thermally connected with the heat sink through the thermally conductive mass 138 into the copper pad 124 and through the adhesive and copper material in the holes 128 and 130 into the pad 126 and then through the thermally conductive mass 142.

Figure 14:
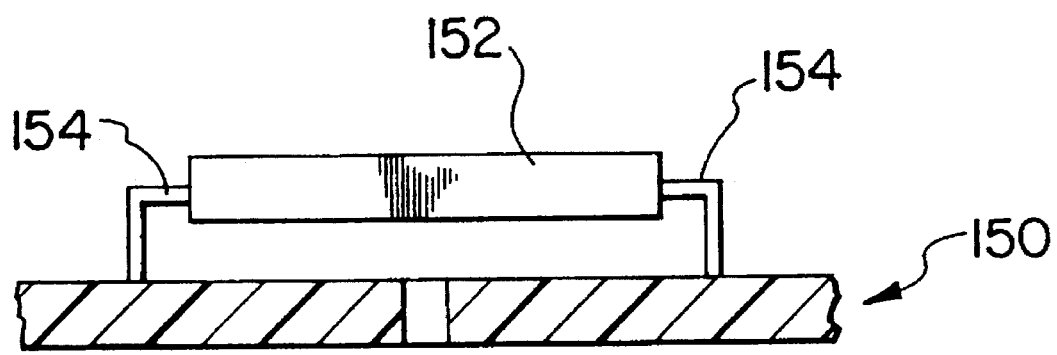
FIGS. 14, 15 and 16 show different stages in the manufacture of a printed circuit board structure according to a sixth embodiment.
Figure 15:
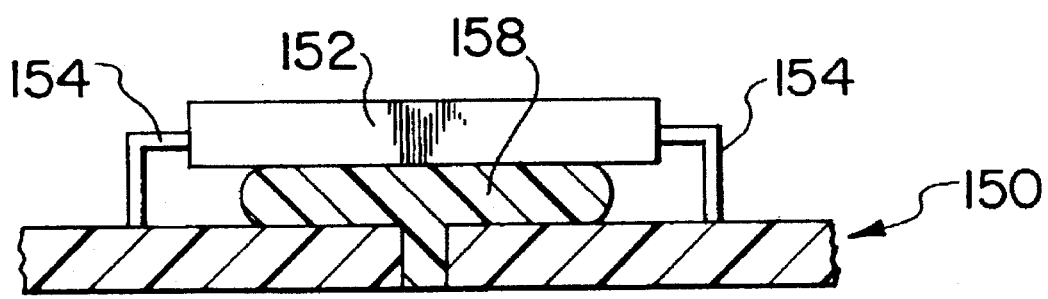
Figure 16:
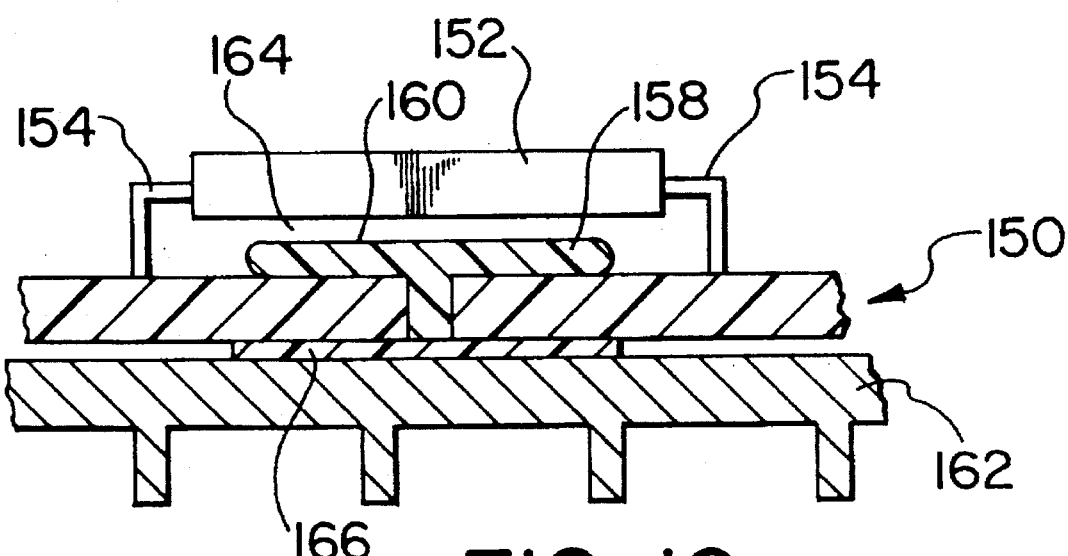

A sixth embodiment now to be described provides a circuit board and heat sink structure in which heat is not conducted into the heat sink from a particular electronic component until that component has heated to a fully operational temperature. As shown by FIG. 14, a printed circuit board 150 has on one of its surfaces an electronic component 152 connected to electrical terminals of the board by electrical leads 154 of the component. A single hole 156 is provided through the board beneath the component. With a primer, e.g. a silane based silicon primer provided upon the surface of the hole and surrounding surfaces on both sides of the board and also with a release agent applied to surfaces of the component 152, a thermally conductive viscous material, e.g. a silicone based thermal conductive adhesive, is injected through the hole 156. The release agent is any material which will prevent the viscous material from adhering the component 152. Suitable release agents include liquid detergents. This viscous material is injected through the hole so that it fills the space between the component 152 and the printed circuit board 150 to form a mass 158 (FIG. 15), and with the assembly subjected to a temperature substantially equal to the fully operational temperature of the component 152, the mass 158 of the compound is cured. The cure temperature sets the approximate contact temperature of the mass 158 to the component 152. The mass 158 adheres to the surface of the printed circuit board but does not adhere to the surface of the component 152 because of the location of the release agent around the surface of the component. As a result of this, upon cooling to ambient temperature, the mass 158 contracts upon heat loss so that its upper surface 160 moves out of engagement with the component 152 thereby providing a gap 164 through which heat cannot be conducted. The assembly is completed by the location of a planar heat sink 162 on the other side of the board, the heat sink being caused to adhere to the printed circuit board in a position opposite to each of the devices 152 by the use of a thermally conducting adhesive in a manner similar to that described in the fifth embodiment. This adhesive provides a thermally conductive pad 166 which is physically connected to the mass 158 through the bore 156.

In use, upon passage of electrical current through each of the electrical components 152, heat cannot be transmitted directly to the heat sink 162 by conduction through the thermally conductive mass 158 because the mass at this stage does not lie in engagement with the component 152. However, as the temperature of the component 152 increases, heat is transferred to a small degree by convection and radiation to the mass 158 and this causes it to expand until finally, at the fully operational temperature of the component 152, the surface 160 contacts the component and heat transfer commences by conduction from the component into the mass 158.

As may be seen from the above description, with the mass 158 being cured substantially at the fully operational temperature of the component 152 then sufficient heat will cause subsequent expansion of the mass 158 during use into contact with the component when the component temperature is substantially equal to the fully operational temperature of the component. As the heat cannot be conducted from the component into the mass until this temperature is reached because of the gap between component and mass, then the component is allowed to reach its operating temperature relatively quickly. This has the effect of reducing local relative humidity In the vicinity of the component during power idling (lower power) hence it minimizes the amount of condensation which may settle upon the component and which may cause damage thereto. A drying atmosphere around the component is thus quickly developed with moisture intrusion being appropriately dispelled. However, upon the mass 158 contacting the component when the required component full operational temperature has been reached, then the component is maintained substantially at its full operational temperature as heat conduction commences through the mass and directly into the heat sink.

In a modification (not shown) of the sixth embodiment, the structure described therein may be provided with pads similar to the copper pads 124 and 126 of the fifth embodiment which are interconnected by copper extending through the bore 156 and through a plurality of other bores if these are required. In this case the mass 158 would adhere directly to the copper pads 124 and 126.

In the sixth embodiment the material of the mass should have a low modulus of elasticity so as to minimize stresses upon contacting the component. It should also have a high coefficient of thermal expansion to allow substantial movement of the material into and out of contact with the component. Heat induced stresses are thereby minimized.

What is claimed is:

1. A method of making a printed circuit board and heat sink structure comprising:

providing a circuitry layer and a plurality of electronic components upon the circuitry layer;

mounting the circuitry layer upon one side of a heat conductive layer means detining a printed circuit board which comprises a heat insulating layer and a first and second heat conductive layers disposed one upon each side thereof and extending across the heat insulating layer and across an area of the printed circuit board between positions in which the heat conductive layer means lies opposite to the plurality of electronic components, the conductive layers interconnected by heat conductive members extending through the heat insulating layer and providing heat conductive means between the electronic components and the first heat conductive layer;

and locating a heat sink on the other side of the heat conductive layer means and in a position spaced from the second heat conductive layer, and connecting the heat sink with the second heat conductive layer by thermally conductive bridge members which extend in localized and spaced positions between the heat sink and the second heat conductive layer.

2. A method of making a printed circuit board and heat sink structure comprising:

providing a printed circuit board with a heat conductive layer on each side of the board and with heat conductive material extending through holes formed in the board to thermally interconnect the two conductive layers;

mounting an electronic component in spaced relationship from the conductive layer on the one side of the board and with the component having electrical leads connected to electrical terminals on the board;

injecting a thermally conductive viscous substance through a hole in the board from the other side of the board to cause the viscous substance to thermally connect the electrical component and the conductive layer on the one side of the board and cause flow of the viscous substance in a reverse direction into other holes in the board beneath the electronic component;

and then attaching a heat sink with a thermally conductive material to the conductive layer on the other side of the board.

3. A method according to claim 2 comprising providing the two layers as two layers of copper on the two sides of the board and coating surfaces of the holes in the board with the copper to interconnect the two layers.

4. A method of making a printed circuit board and heat sink structure comprising:

mounting an electronic component upon one side of a printed circuit board and in a position having a facing surface spaced from the board and with electrical leads of the component connected to electrical terminals of the board;

injecting a thermally conductive curable resin between the electronic component and the board, the resin prevented from engaging the surface of the component by the presence of a release agent between the component and resin;

then at a desired temperature, curing the resin to form a thermally conductive mass, the mass contracting away from the component during cooling and being expansible during subsequent heating;

and thermally conducively connecting the cured resin to heat sink.

* * * * *